(12) United States Patent
Hölzl et al.

(10) Patent No.: US 7,122,865 B2
(45) Date of Patent: Oct. 17, 2006

(54) SOI WAFER AND PROCESS FOR PRODUCING IT

(75) Inventors: Robert Hölzl, Postmünster (DE); Dirk Dantz, Sassenburg (DE); Andreas Huber, Garching (DE); Ulrich Lambert, Emmerting (DE); Reinhold Wahlich, Tittmoning (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 10/853,322

(22) Filed: May 25, 2004

(65) Prior Publication Data

US 2004/0251500 A1   Dec. 16, 2004

(30) Foreign Application Priority Data

Jun. 12, 2003   (DE)  ................ 103 26 578

(51) Int. Cl.
*H01L 27/01* (2006.01)
*H01L 27/12* (2006.01)
*H01L 31/0392* (2006.01)

(52) U.S. Cl. ............... 257/352; 257/347; 257/E27.112; 257/E21.32

(58) Field of Classification Search ........ 257/347–352, 257/E27.112, E21.32
See application file for complete search history.

(56) References Cited

U.S. PATENT DOCUMENTS

| | | | |
|---|---|---|---|
| 5,374,564 A | | 12/1994 | Bruel |
| 5,413,952 A | * | 5/1995 | Pages et al. ................ 438/406 |
| 5,930,643 A | * | 7/1999 | Sadana et al. .............. 438/407 |
| 6,232,142 B1 | | 5/2001 | Yasukawa |
| 6,326,279 B1 | | 12/2001 | Kakizaki et al. |
| 6,403,450 B1 | * | 6/2002 | Maleville et al. .......... 438/471 |
| 6,566,255 B1 | | 5/2003 | Ito |
| 6,608,327 B1 | * | 8/2003 | Davis et al. .................. 257/76 |
| 2002/0094663 A1 | | 7/2002 | Holman |
| 2002/0167068 A1 | * | 11/2002 | Hsu et al. .................... 257/507 |
| 2003/0203657 A1 | * | 10/2003 | Ito .............................. 438/795 |
| 2004/0108537 A1 | * | 6/2004 | Tiwari ........................ 257/314 |
| 2004/0115905 A1 | * | 6/2004 | Barge et al. ................ 438/473 |
| 2005/0133866 A1 | * | 6/2005 | Chau et al. ................. 257/348 |
| 2005/0287767 A1 | * | 12/2005 | Dantz et al. ................ 438/459 |

FOREIGN PATENT DOCUMENTS

| | | |
|---|---|---|
| CN | 1132408 A | 10/1996 |
| DE | 4414947 | 8/1995 |
| DE | 69225911 | 6/1998 |
| DE | 10131249 | 5/2002 |
| EP | 533551 | 3/1993 |
| EP | 707 338 A2 | 4/1996 |
| EP | 829559 | 3/1998 |
| EP | 674806 | 6/1998 |
| EP | 866150 | 9/1998 |
| EP | 905767 | 3/1999 |
| EP | 1 225 625 A1 | 7/2002 |
| WO | 03/003430 | 1/2003 |

OTHER PUBLICATIONS

Patent Abstract of Japan corresponding to JP 01-315129.
Patent Abstract of Japan corresponding to JP 03-069144.
Patent Abstract of Japan corresponding to JP 03-069145.
Patent Abstract of Japan corresponding to JP 09-162088.
English Derwent Abstract AN 1998-161363 corresponding to EP0829559.
English Derwent Abstract An 1995-303208 corresponding to DE 44 14 947.
English Derwent Abstract AN 1998-482980 corresponding to EP 0 866 150.
Handbook of deposition technologies for films and coatings, R.F. Bunshah, 1994, 2nd ed., p. 184ff, p. 134ff.
English Derwent Abstract AN 1993-095807 corresponding to EP0533551.
Enlish Derwent Abstract AN 2002-464528 corresponding to DE 101 31 249.
English Derwent Abstract AN 1998-009490 corresponding to CN 1132408 A.

* cited by examiner

*Primary Examiner*—Kenneth Parker
*Assistant Examiner*—Jesse A. Fenty
(74) *Attorney, Agent, or Firm*—Brooks Kushman P.C.

(57) ABSTRACT

An SOI wafer, includes a substrate made from silicon, an electrically insulating layer with a thermal conductivity of at least 1.6 W/(Km) and a single-crystal silicon layer with a thickness of from 10 nm to 10 μm, a standard deviation of at most 5% from the mean layer thickness and a density of at most 0.5 HF defects/cm$^2$.

A process is for producing an SOI wafer of this type, in which a substrate wafer made from silicon is joined to a donor wafer via a layer of the electrically insulating material which has previously been applied. The donor wafer bears a donor layer of single-crystal silicon, with a concentration of vacancies of at most $10^{12}$/cm$^3$ and of vacancy agglomerates of at most $10^5$/cm$^3$. After the wafers have been joined, the thickness of the donor wafer is reduced in such a manner that the single-crystal silicon layer having these properties is formed from the donor layer, this single-crystal silicon layer being joined to the substrate wafer via the layer of electrically insulating material.

11 Claims, No Drawings

SOI WAFER AND PROCESS FOR PRODUCING IT

CROSS REFERENCE TO RELATED APPLICATIONS

Applicant claims priority under 35 U.S.C. §119 of German Application No. 103 26 578.3 filed Jun. 12, 2003.

BACKGROUND OF THE INVENTION

1. Field of the Invention

The invention relates to an SOI wafer which comprises a silicon substrate, an electrically insulating layer with a high thermal conductivity and a silicon layer with a low defect density and high layer thickness homogeneity, and to a process for producing the SOI wafer.

2. The Prior Art

SOI wafers (Silicon On Insulator) generally comprise three layers: on the front surface of a silicon wafer, which forms the bottom layer, there is firstly an electrically insulating layer, for example of silicon dioxide. In turn, on the electrically insulating layer there is a thin single-crystal silicon layer, in which the electrical components are subsequently fabricated. However, SOI wafers with just two layers are also known. These comprise an electrically insulating substrate, for example glass or sapphire, and a thin silicon layer. For component fabrication in the line widths which are expected in the future, in particular for the fully depleted technology (in which the depletion zone of the transistors is equal to the thickness of the single-crystal silicon layer), the single-crystal silicon layer will need to be very thin, i.e. to have a thickness of 0.1 μm or less.

The insulating layer of silicon dioxide which is customarily used has the drawback of a low thermal conductivity of just approx. 1.40 W/(Km). The heat which is generated during switching of the components therefore cannot be dissipated downward to a sufficient extent, resulting in the formation of areas with locally high temperatures (known as hot spots). These hot spots reduce the conductivity of the components, their maximum possible clock rate and their long-term stability or reliability.

Therefore, numerous efforts have been made to allow the use of electrically insulating materials of higher thermal conductivity for the SOI technology. By way of example, sapphire (aluminum oxide, $Al_2O_3$) can be used as substrate material for the thin silicon layer (Silicon On Sapphire, SOS). The thermal conductivity of α-aluminum oxide, at 30 W/(Km), is well above that of silicon dioxide. The drawbacks of this structure, in addition to its complex production, are the fact that the lattice constants of silicon and sapphire differ by approx. 10% and also the difference in the coefficient of thermal expansion (Si: $3.8 \cdot 10^{-8}$/K; $Al_2O_3$: $9.2 \cdot 10^{31}$ s/K). For example in the heteroepitaxy process, this leads not only to contamination and autodoping effects from aluminum, but also to crystallographic defects (dislocations, twinning, stacking faults), which can only be partially eliminated in a subsequent thermal annealing step. Vertical film inhomogeneities and lateral stresses at the silicon-aluminum oxide interface lead to a drop in charge carrier mobilities. Therefore, SOS is not used in ultrafast microelectronics, but rather for radiation-resistant applications. A further drawback consists in the fact that the silicon layer cannot be electrically influenced from below, since the substrate consists of the electrically insulating aluminum oxide over its entire thickness.

SOI wafers with three layers, comprising a substrate formed from a semiconducting material, an electrically insulating layer and a layer of semiconducting material above the electrically insulating layer, do not have the latter drawback.

JP01-315129 has described an SOI wafer of this type, which comprises a silicon substrate, an insulating layer of aluminum oxide and a thin silicon layer. JP03-069144 and JP03-069145 describe the production of an insulating layer of magnesium aluminum oxide (Spinell, $MgAl_2O_4$), on a silicon substrate. JP09-162088 discloses that α- and Y-aluminum oxide ($Al_2O_3$), magnesium aluminum oxide ($MgAl_2O_4$), cerium oxide ($CeO_2$) and calcium fluoride ($CaF_2$) can be used as an insulating layer between a silicon substrate and a thin silicon layer. The insulating layer is produced on a silicon substrate by low pressure chemical vapor deposition (LPCVD) or molecular beam epitaxy (MBE). Then, a silicon layer is deposited epitaxially on the insulating layer. Alternatively, the silicon layer can also be produced by joining a further silicon wafer to the insulating layer and then setting the desired layer thickness by grinding and polishing.

SOI wafers in accordance with the prior art documents cited, however, are of only limited suitability for the fabrication of electronic components, such as microprocessors, memory components for laptops or chips for telecommunications applications, since they give a low yield during the fabrication of electronic components.

SUMMARY OF THE INVENTION

Therefore, it is an object of the present invention to provide an SOI wafer which has an electrically insulating layer with a high thermal conductivity and ensures an increased yield during the subsequent fabrication of electronic components.

The above object is achieved according to the present invention by an SOI wafer, comprising a substrate made from silicon, at least one electrically insulating layer with a thermal conductivity of at least 1.6 W/(Km) in at least one spatial direction above at least one surface of the substrate, and a single-crystal silicon layer with a thickness in the range from 10 nm to 10 μm, a standard deviation of at most 5% from the mean layer thickness and a density of at most 0.5 HF defects/$cm^2$ over the electrically insulating layer.

Materials used for the electrically insulating layer may be all compounds which have both an electrically insulating action and a thermal conductivity of at least 1.6 W/(Km) in at least one spatial direction. Isotropic materials have the same thermal conductivity in all spatial directions, and anisotropic materials may have different thermal conductivities in different spatial directions. According to the invention, it is sufficient for the minimum value indicated to be reached or exceeded in one spatial direction. Examples of suitable materials include zirconium silicate ($Zr[SiO_4]$), barium titanate ($BaTiO_3$) and zirconium oxide ($ZrO_2$). Materials with thermal conductivities of at least 9 W/(Km), such as for example aluminum oxide ($Al_2O_3$), magnesium oxide (MgO), magnesium aluminum oxide ($MgAl_2O_4$), thorium oxide ($ThO_2$), boron nitride (BN), boron carbide ($BC_x$) and strontium titanate ($SrTiO_3$), are preferred. Materials with thermal conductivities of at least 100 W/(Km), such as for example diamond, aluminum nitride (AlN) and beryllium oxide (BeO), are particularly preferred. It is also possible to use other binary and ternary oxides of the general formula $A_xB_yO_n$, where A and B may be metals, semimetals or nonmetals, O stands for oxygen. x, y and n are positive integer numbers, in the case of x and y including zero. The higher the thermal conductivity of the electrically insulating layer, the more favorable the effects on the components, since hotspots can be reduced. However, the condition relating to the electrical insulation property must always be ensured.

In addition, the electrical insulators with a high thermal conductivity have to satisfy the condition that they must withstand the process temperatures required during fabrication of electronic components without being damaged. They have to be thermally stable up to at least 1000° C. without decomposing, changing their crystal structure or losing their properties as heat conductors or electrical insulators. These conditions are satisfied, for example, by the materials specifically mentioned above. Therefore, the SOI wafers according to the invention are also suitable for a CMOS (Complementary Metal-Oxide-Semiconductor) process, which requires temperatures of up to 1000° C.

The abovementioned materials for the insulating layer have no significant adverse effect on the electrical properties of the silicon layer above. They are inert with respect to the reducing action of silicon, i.e. they do not form silicides and are also not reduced to form the pure metal.

The thickness of the electrically insulating layer is in the range from 1 nm to 1 μm, with layer thicknesses between 1 nm and 200 nm being preferred and layer thicknesses of between 2 nm and 100 um being particularly preferred. The electrically insulating layer may be a single layer or may be composed of at least two layers of different electrically insulating materials.

The defects in the top silicon layer are usually characterized by means of defect etching. To determine what are known as the HF defects, the wafer is exposed to an $HF/H_2O$ mixture (1:1) for 15 min. To determine what are known as the Secco defects, the wafer is exposed to a $K_2Cr_2O_7/HF/H_2O$ mixture in a ratio of 44 g/1 kg/5 kg for a time which is required for 75% of the thin silicon layer to be removed. The etching rate of the Secco etchings is known and is 2 to 2.5 nm/s, and consequently the etching time can easily be matched to the thickness of the silicon layer. After the etching operation, the defects are analyzed and counted under a Normarski microscope. The SOI wafer according to the invention has a density of at most 0.5 HF defects/cm². An SOI wafer which simultaneously has a density of at most $1 \cdot 10^4$ Secco defects/cm² is preferred.

Above the electrically insulating layer, the SOI wafer according to the invention bears a thin single-crystal silicon layer with a thickness in the range from 10 nm to 10 μm and a standard deviation of at most 5% from the mean layer thickness.

During component fabrication, the low defect density of the silicon layer leads to a high yield of functional components. The low standard deviation in the layer thickness evidently results in a tight distribution of the transistor characteristics, which in turn improves the yield of usable components and the performance of these components. For these reasons, the SOI wafer according to the invention is eminently suitable for the fabrication of electronic components of even the most advanced generation.

The invention also relates to a process for producing an SOI wafer, which includes the following steps:

providing a substrate wafer made from silicon, providing a donor wafer with a surface donor layer of single-crystal silicon, the thickness of which corresponds to at least the final thickness of the silicon layer to be produced therefrom and which has a concentration of vacancies of at most $10^{12}/cm^3$ and of vacancy agglomerates of at most $10^5/cm^3$, applying a layer of an electrically insulating material with a thermal conductivity of at least 1.6 W/(Km) in at least one spatial direction to one side of the substrate wafer and/or to that side of the donor wafer which bears the donor layer, then joining of the substrate wafer and the donor wafer, in such a manner that the side of the donor wafer which bears the donor layer is joined to the substrate wafer via the electrically insulating layer, and then reducing the thickness of the donor wafer, so that a single-crystal silicon layer with a final thickness in the range from 10 nm to 10 μm, a standard deviation of at most 5% from the mean layer thickness and a density of at most 0.5 HF defects/cm² is formed from the donor layer, this single-crystal silicon layer being joined to the substrate wafer via the layer of electrically insulating material.

The starting point for the process according to the invention are two wafers, namely a donor wafer and a substrate wafer (also known as handle wafer).

All silicon wafers of any desired diameter (e.g. 3", 4", 5", 6", 8", 12" or larger), which are polycrystalline or, preferably, in single crystal form, can be used as a substrate wafer. The substrate wafer may be doped, for example with one or more of the electrically active elements boron, aluminum, gallium, phosphorus, arsenic or antimony. It may also be doped with additional elements, such as germanium, nitrogen or carbon, in order to effect lattice matching between the substrate wafer and the electrically insulating layer. Furthermore, the mechanical stability of the substrate wafer with respect to dislocations and slippages can be increased with the aid of a co-doping (e.g. nitrogen with a concentration in the range from $1 \cdot 10^{14}/cm^3$ to $1 \cdot 10^{16}/cm^3$). The use of silicon wafers which are highly doped with carbon, nitrogen or boron is particularly preferred.

According to the invention, the donor wafer used is a wafer with a surface donor layer of single-crystal silicon, the thickness of the donor layer corresponding at least to the final thickness of the silicon layer which is to be produced therefrom. The donor layer is substantially free of vacancies and vacancy agglomerations (crystal-originated particles or COPs). In the context of the invention, what this means is that the concentration of vacancies is at most $10^{12}/cm^3$ and the concentration of vacancy agglomerates is at most $10^5/cm^3$. The donor layer is located on that surface of the donor wafer which is joined to the substrate wafer via the electrically insulating layer. The donor wafer used may, for example, be a wafer whose donor layer is an epitaxial silicon layer. On account of the low deposition rate during the epitaxy process, the epitaxial layer does not have any vacancies or vacancy agglomerates. It is also possible to use a silicon wafer from which vacancies and vacancy agglomerates have been removed either at the surface or through its entire volume by means of heat treatment, as described for example in EP 829559A1. it is also possible for the donor wafer used to be a silicon wafer which has been produced from a vacancy-free single crystal. Silicon single crystals of this type can be produced using the Czochralski crucible pulling process, in which case accurately defined conditions must be maintained during the crystal pulling, as described for example in DE 4414947A1 and EP 866150A1. The main condition for the production of vacancy-free silicon single crystals is that the inequation $v/G<1.34 \cdot 10^{-3}$ cm²/(minK), where v is the growth rate and G is the axial temperature gradient at the liquid/solid phase boundary, be satisfied.

All wafers of any desired diameters (e.g. 3", 4", 5", 6", 8", 12" or larger, the diameter preferably being identical to that of the substrate wafer) which have a vacancy-free and vacancy-agglomerate-free donor layer of single-crystal silicon can be used as the donor wafer. By way of example, the donor wafer may be a single-crystal silicon wafer. However, it may also itself have a plurality of layers, in which case at least the donor layer consists of silicon in single crystal form. The silicon wafer or at least the donor layer may be doped, for example with one or more of the electrically active elements boron, aluminum, gallium, phosphorus, arsenic or antimony, and this is also to be understood as encompassing highly doped silicon. It may also be doped with additional elements, such as germanium, nitrogen or carbon, in order to produce lattice matching between the donor layer and the electrically insulating layer.

According to the invention, first of all a layer of an electrically insulating material is produced on that surface of the donor wafer which bears the donor layer or on at least one side of the substrate wafer, for example by means of the evaporation coating technique which is known from the prior art, for example using what is known as a telefocus gun. The description of the apparatus and procedure is to be found in the "*Handbook of deposition technologies for films and coatings*", Bunshah, R. F., Noyes Publications, New Jersey (1994), 2nd edition, pages 184 ff, 134 ff. The layer thickness of the electrically insulating material is in the range from 1 nm to 1 μm, with layer thicknesses of between 1 nm and 100 nm being preferred and layer thicknesses of between 2 nm and 80 nm being particularly preferred.

However, it is also possible to use all other known deposition processes, such as for example APCVD (Atmospheric Pressure Chemical Vapor Deposition), LPCVD (Low Pressure Chemical Vapor Deposition), MBE (Molecular Beam Epitaxy) or ALD (Atomic Layer Deposition). The optimum deposition process depends on the properties of the electrically insulating material and is sought out accordingly. The abovementioned "*Handbook of deposition technologies for films and coatings*" explains which processes can preferably be used for which substances. For example, the LPCVD process or the PECVD process (Plasma Enhanced Chemical Vapor Deposition) can be used for AlN.

The process according to the invention can also be modified in such a manner that first of all a very thin silicon dioxide layer with a thickness of less than 5 nm is produced by thermal oxidation on one or both of the silicon wafers. The electrically insulating material is applied either to the silicon dioxide or to the wafer which has not been provided with silicon dioxide. Further variants result from a combination of a plurality of layers, although at least one of these layers must be electrically insulating.

Then, the substrate wafer is bonded to the donor wafer in such a manner that the donor wafer is joined to the substrate wafer by means of the side which is free of vacancies and vacancy agglomerates (COPs) via the electrically insulating layer. If only one side of the substrate wafer has been provided with an electrically insulating layer, it is this side which is joined to that side of the donor wafer which is free of vacancies and vacancy agglomerates (COPs). If both wafers have been provided with an electrically insulating layer, the two wafers are joined to one another via the electrically insulating layers. The two wafers are preferably joined using a commercially available bonder.

In the final step, the thickness of the donor wafer is reduced in such a manner that a silicon layer with a final thickness in the range from 10 nm to 10 μm and with a standard deviation of at most 5% from the mean layer thickness and a density of at most 0.5 HF defects/cm$^2$ is formed from the donor wafer. The final step carried out is preferably a polishing step as described, for example, in EP905767A1.

It is preferable for the wafer, after the substrate wafer and the donor wafer have been bonded, to be subjected to a heat treatment (bond anneal) at a temperature between 1000° C. and 1200° C., in order to improve the properties of the interface between the two wafers which have been joined. This high-temperature treatment also leads to partial sintering of the electrically insulating layer, so that its properties are improved. The bond anneal may take place either before or after the step in which the thickness of the donor wafer is reduced to the desired final thickness of the silicon layer.

It is particularly preferred for the thickness of the donor wafer to be reduced by separating along a previously prepared separation layer in the donor wafer.

The separation layer may, for example, be produced by implantation of ions, for example hydrogen ions, as described in EP533551A1. The electrically insulating layer may be applied to the donor wafer or, independently of this, to the substrate wafer either before or after implantation. The separation along the separation layer takes place after the two wafers have been bonded, for example by means of a heat treatment (known as a split anneal) at temperatures from 300 to 500° C.

However, the separation layer may also, as described in DE10131249A1, be produced by subjecting a silicon wafer with suitable recesses applied at the surface to a heat treatment, which causes the surface to close up and voids to form below the surface. In this case, the separation layer is defined by a layer of voids. In this process too, the donor wafer has to be free of vacancies and vacancy agglomerates (COPs) in the sense of the invention. In this process, the electrically insulating layer is preferably deposited on the substrate wafer. After the two silicon wafers have been joined, they are split at the separation layer defined by the voids, for example by thermal, mechanical or chemical means. Suitable processes are described in DE10131249A1.

The following result has, completely surprisingly and unexpectedly, emerged when carrying out the process according to the invention: if a donor wafer which has neither vacancies nor vacancy agglomerates (COPs) at least in the donor layer consisting of single-crystal silicon is used, and if this donor wafer is joined to a substrate wafer via an electrically insulating layer of high thermal conductivity, the joined wafers can subsequently be reduced to a very homogenous layer thickness by polishing or other planarizing processes. The temperature-compensating effect of the insulation layer, together with the absence of vacancies in the silicon layer, evidently leads to a configuration which, both during the split anneal and during the polishing, results in very homogenous removal of material during the polishing. The result is an SOI wafer, the electrically insulating layer of which has a very good thermal conductivity and the thin silicon layer of which at the same time has a low defect density and a high layer thickness homogeneity. The density of the HF defects is less than 0.5/cm$^2$ and the density of the Secco defects is less than $1 \cdot 10^4$/cm$^2$. The standard deviation from the mean layer thickness is at most 5%.

DETAILED DESCRIPTION OF PREFERRED EMBODIMENTS

A preferred embodiment of the invention is explained below on the basis of the example of beryllium oxide as the electrically insulating material, although the general process is not restricted to beryllium oxide:

The donor wafer used is a silicon wafer which is produced from a vacancy-free single crystal. The vacancy-free single crystal is produced by Czochralski crucible pulling, with the inequation v/G<1.34·10⁻³ cm²/(minK) being satisfied during crystal pulling.

A layer of beryllium oxide (BeO) is deposited on the donor wafer by evaporation coating. The evaporation temperature selected during the evaporation by means of tele-focus gun is a temperature of from 2400° C. to 2700° C. The crucible material used is tungsten, which is both resistant to BeO and resistant to melting. A layer of BeO with a thickness of 50 nm is produced.

Then, the wafer, as described in EP533551A1, is implanted with hydrogen and then bonded to a second silicon wafer, the substrate wafer. This is followed by a heat treatment (split anneal) at 450° C. In this heat treatment, the donor wafer is split at the separation layer defined by the hydrogen implantation, so that the substrate wafer then bears a layer of thermally conductive, electrically insulating material and, above this, a layer of silicon. The remainder of the donor wafer is split off by the split anneal.

Then, the wafer is subjected to a further heat treatment (bond anneal) at 1100° C., in order to improve the interfacial properties between the silicon layer and the electrically insulating layer. This high-temperature treatment also leads to partial sintering of the layer consisting of BeO, so that its properties are improved. Then, that side of the wafer which bears the thin silicon layer is polished as described in EP905767A1.

The SOI wafer which is produced in this way has a density of HF defects of 0.3/cm² and of Secco defects of 0.7·10⁴/cm². The standard deviation from the mean layer thickness is 4%.

Accordingly, while a few embodiments of the present invention have been shown and described, it is to be understood that many changes and modifications may be made thereunto without departing from the spirit and scope of the invention as defined in the appended claims.

What is claimed is:

1. An SOI wafer, comprising
a substrate made from silicon,
at least one continuous electrically insulating layer with a thermal conductivity of at least 1.6 W/(Km) in at least one spatial direction above at least one surface of the substrate, and
a single-crystal silicon layer with a thickness in the range from 10 nm to 10 µm, a standard deviation of at most 5% from the mean layer thickness and a density of at most 0.5 HF defects/cm² over the electrically insulating layer.

2. The SOI wafer as claimed in claim 1, which has a density of at most 1·10⁴ Secco defects/cm².

3. The SOI wafer as claimed in claim 1, wherein the electrically insulating layer has a thermal conductivity of at least 9 W/(Km).

4. The SOI wafer as claimed in claim 1, wherein the electrically insulating layer has a thermal conductivity of at least 100 W/(Km).

5. The SOI wafer as claimed in claim 1, wherein the electrically insulating layer comprises at least two layers of different electrically insulating materials.

6. An SOI wafer of claim 1, wherein a single electrically insulating layer covers the entire single-crystal silicon layer.

7. An SOI wafer, comprising
a substrate made from silicon,
one or more continuous electrically insulating layers, at least one layer having a thermal conductivity of at least 1.6 W/(Km) in at least one spatial direction above at least one surface of the substrate, and
a single-crystal silicon layer with a thickness in the range from 10 nm to 10 µm, a standard deviation of at most 5% from the mean layer thickness and a density of at most 0.5 HF defects/cm², over the electrically insulating layer, wherein said SOI wafer is produced by a process comprising
providing a substrate wafer made from silicon,
providing a donor wafer with a surface donor layer of single-crystal silicon, the thickness of which corresponds to at least a final thickness of the silicon layer to be produced therefrom and which has a concentration of vacancies of at most 10¹²/cm³ and of vacancy agglomerates of at most 10⁵/cm³,
applying a layer of an electrically insulating material with a thermal conductivity of at least 1.6 W/(Km) in at least one spatial direction to one side of the substrate wafer, to that side of the donor wafer which bears the donor layer, or to both said one side of the substrate wafer and to said side of the donor wafer which bears the donor layer, then
joining of the substrate wafer and the donor wafer, in such a manner that the side of the donor wafer which bears the donor layer is joined to the substrate wafer via the electrically insulating layer(s), and then
reducing the thickness of the donor wafer, so that a single-silicon layer with a final thickness in the range from 10 nm to 10 µm, a standard deviation of at most 5% from the mean layer thickness and a density of at most 0.5 HF defects/cm² formed from the donor layer, this single-crystal silicon layer being joined to the substrate wafer via the layer of electrically insulating material.

8. The SOI wafer as claimed in claim 7, which has a density of at most 1·10⁴ Secco defects/cm².

9. The SOI wafer as claimed in claim 7, wherein the electrically insulating layer has a thermal conductivity of at least 9 W/(Km).

10. The SOI wafer as claimed in claim 7, wherein the electrically insulating layer has a thermal conductivity of at least 100 W/(Km).

11. The SOI wafer as claimed in claim 7, wherein the electrically insulating layer comprises at least two layers of different electrically insulating materials.

* * * * *

UNITED STATES PATENT AND TRADEMARK OFFICE
CERTIFICATE OF CORRECTION

| | | |
|---|---|---|
| PATENT NO. | : 7,122,865 B2 | Page 1 of 1 |
| APPLICATION NO. | : 10/853322 | |
| DATED | : October 17, 2006 | |
| INVENTOR(S) | : Robert Hölzl et al. | |

It is certified that error appears in the above-identified patent and that said Letters Patent is hereby corrected as shown below:

Column 8, Line 40, Claim 7:

Delete "single-silicon" and insert therefor:

-- single-crystal silicon --.

Signed and Sealed this

Thirteenth Day of March, 2007

JON W. DUDAS
*Director of the United States Patent and Trademark Office*